United States Patent [19]
Sato

[11] 3,961,962
[45] June 8, 1976

[54] PHOTOMASK MATERIAL AND METHOD FOR PRODUCING SAME

[75] Inventor: Masamichi Sato, Asaka, Japan

[73] Assignee: Fuji Photo Film Co., Ltd., Minami-ashigara, Japan

[22] Filed: Nov. 29, 1974

[21] Appl. No.: 528,317

[30] Foreign Application Priority Data
Nov. 29, 1973  Japan.............................. 48-134784

[52] U.S. Cl. .................................. 96/87 R; 96/67; 96/86 R; 96/94 BF; 204/38 A
[51] Int. Cl.² ........................................... G03C 1/78
[58] Field of Search ......... 96/86 R, 67, 87 R, 94 BF

[56] References Cited
UNITED STATES PATENTS

| | | | |
|---|---|---|---|
| 3,346,384 | 10/1967 | Gaynor .............................. | 96/86 R |
| 3,615,553 | 10/1971 | Wainer............................... | 96/86 R |
| 3,811,894 | 5/1974 | Yonezawa........................... | 96/86 R |
| 3,874,879 | 4/1975 | Rasch................................. | 96/86 R |

Primary Examiner—Ronald H. Smith
Attorney, Agent, or Firm—Sughrue, Rothwell, Mion, Zinn & Macpeak

[57] ABSTRACT

A photomask material which comprises a transparent support having thereon an aluminum oxide thin film formed by anodic oxidation, the oxide thin film containing with a uniform distribution over the entire film a number of fine pores having a light-sensitive silver halide therein, and a method for producing the photomask material which comprises providing an aluminum thin layer on a transparent support, anodically oxidizing the aluminum thin layer by contacting the aluminum thin layer with an electrolytic solution such that the rate of anodic oxidation of the aluminum thin layer is continuously reduced in a direction of from one portion of the thin layer to another portion of the thin layer to thereby render the thin layer transparent, and incorporating a light-sensitive silver halide in a number of the resulting fine pores formed in the aluminum oxide thin film and uniformly all over the aluminum oxide thin film.

10 Claims, 3 Drawing Figures

PHOTOMASK MATERIAL AND METHOD FOR PRODUCING SAME

BACKGROUND OF THE INVENTION

1. Field of the Invention

The present invention relates to a novel photomask material and a method for producing same.

2. Description of the Prior Art

Photomasks having high resolving power are necessary in the production of, for example, the so-called integrated circuits (IC). As the photomask material for producing photomasks, a photographic material comprising a transparent support having coated thereon a silver halide photographic emulsion, in which material silver halide images are formed to prepare a photomask (hereinafter referred to as an emulsion mask) has been used. A large amount of this type of material is still being widely used.

However, an emulsion mask has many disadvantages in that the image layer is mechanically weak, the silver image is opaque to visible light as well, and edge acuity is poor due to the grain property of silver.

Therefore, an excellent photomask without these disadvantages has been desired in this field. The so-called hard mask, represented by a chromium photomask, has been developed to satisfy these requirements. At present, a chromium oxide mask, an iron oxide mask, a silicon mask, etc., are also known as well as the above-described chromium mask. These masks, except for the chromium mask, provide semi-transparent mask images (with these masks usually being called "see-through masks") and these hard masks are extremely strong and durable. However, in comparison with the above-described emulsion mask, these masks possess the following defects. That is, since the hard mask material itself is not light-sensitive, a photoresist must be coated thereon to utilize the light sensitivity of the photoresist, in order to prepare a hard mask using a hard mask material. However, the sensitivity of the photoresist is usually on the order of about ASA $10^{-5}$, which is far smaller than the sensitivity of an emulsion mask having a sensitivity on the order of ASA $10^{-2}$. This poor sensitivity requires a prolonged exposure time upon exposing this photomask material using a photo-repeater. Furthermore, a hard mask has the defect that the surface reflection of the mask is so great that light reflected on the surface upon imagewise exposure diffuses within the photoresist layer to reduce the resolving power. Another defect with a hard mask is that, since the mask imageforming layer projects on the support, the mask layer is often chipped when the mask is pressed against a semi-conductor wafer, with the mask image being worn away. This phenomenon naturally leads to a reduction in the life of the hard mask.

Therefore, the development of a photomask which possesses both the advantages of an emulsion mask (i.e., a high sensitivity and low surface reflection) and the advantages of a hard mask (i.e., great durability, see-through ability and good edge acuity) has been strongly desired.

Investigations have now been made to apply the art relating to photographic materials, such as "Metal-Photo", "Alphoto" or like trade named materials, to photomask use. This photographic material is prepared by subjecting the surface of an aluminum plate to anodic oxidation to form an aluminum oxide film of a thickness of several microns to several tens of microns and filling the fine pores of about several hundred angstroms in size, formed in the oxide film, with silver halide (hereinafter referred to for brevity as "aluminum photo material").

With this photographic material, silver images can be formed by subjecting the material to development and fixing processing after imagewise exposure, in a similar manner to ordinary silver halide photographic materials.

As is well known, a photomask must have the property that non-image areas are transparent to the light to which the photoresist is sensitive. However, since the above-described aluminum photo material has an opaque support of an aluminum plate, the material cannot be utilized as a photomask. Therefore, attempts were made to use a material comprising a transparent support having thereon an aluminum thin film layer, in place of the aluminum plate and to subject the thin film layer to anodic oxidation to thereby render the thin film layer transparent. However, according to these investigations, the above attempt cannot actually be practiced with ease due to the following two important problems. Firstly, in subjecting a thick aluminum plate to anodic oxidation, no problems occur because the aluminum base plate functions as an electrode (anode), whereas in subjecting a thin aluminum film (e.g., several microns in thickness) provided on an insulating support to anodic oxidation, the phenomenon occurs that, when anodic oxidation is initiated using the thin aluminum layer as an anode, the aluminum film is completely converted to an oxide film at some portions while at other portions aluminum remains in the form of islands. Although an aluminum oxide film is first formed all over the surface of the aluminum thin layer and then the oxidation gradually proceeds to the interior portion, the oxidation rate is not completely uniform over the entire aluminum thin film layer but differs due to the nature of the portion. If islands of aluminum remain, these areas are insulated and oxidation does not proceed further. As a result, this portion remains opaque. Secondly, the intimate adhesiveness between the oxide film and the support is a problem. Even when aluminum is intimately adhered to the support, the aluminum layer sometimes changes in volume upon conversion of aluminum to aluminum oxide. Thus the intimate adhesiveness between the aluminum oxide layer and the support is degraded.

SUMMARY OF THE INVENTION

The present invention provides a photomask material which comprises a transparent support having thereon an aluminum oxide thin film formed by anodic oxidation, in which the oxide thin film contains a number of fine pores in which a lightsensitive silver halide can be present with a uniform distribution over the entire film and also provides a method for producing the above-described photomask material, which comprises providing an aluminum thin layer on a transparent support, anodically oxidizing the aluminum thin layer by contacting the aluminum thin film with an electrolytic solution (under conditions such that the anodic oxidation rate of the aluminum thin layer is continuously reduced in the direction of from one portion thereof to the other portion thereof) to thereby render the thin layer transparent, and incorporating a light-sensitive silver halide in a number of the resulting fine pores formed in the aluminum oxide thin film and uniformly distributed over the entire oxide film.

DETAILED DESCRIPTION OF THE INVENTION

In these investigations, it was thought the following method could be emplyed to solve the first problem described above. That is, an aluminum thin film layer was formed on a transparent support such as a glass plate using, e.g., a vacuum deposition method, an electrolytic solution was fed onto the aluminum thin film layer in a drop-like or linear form in an amount occupying only a small area, and a direct current voltage was applied using the thin film layer as an anode and contacting the electrolytic solution with a cathode to thereby anodically oxidize the aluminum thin film layer.

Figure 1:
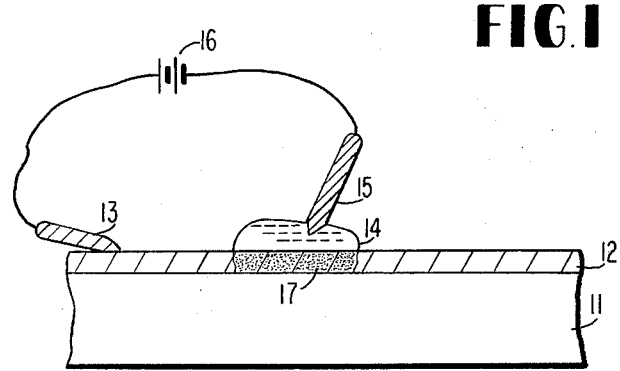
FIG. 1 is a diagram showing a method for conducting anodic oxidation investigated, wherein 12 is an aluminum thin film layer, 13 and 15 are electrode terminals, 14 is a drop of an electrolytic solution, and 17 is an area where aluminum film 12 is oxidized.

FIG. 1 illustrates the condition of anodic oxidation. In FIG. 1, numeral 11 is a transparent support, 12 is an aluminum thin film (several microns in thickness) thereon, 13 is an electrode terminal for rendering the aluminum thin film anodic, 14 is an electrolytic solution, 15 is a cathode, and 16 is a source of DC voltage such as a battery. When electrolysis is conducted employing this arrangement, the small area where the electrolytic solution exists is locally oxidized (the region shown by 17). Where this region is small in area, oxidation uniformly proceeds in the depthwise direction of the aluminum film to reach the boundary at the support. Then, when the electrolytic solution or cathode is moved in one direction, the oxide film region extends in the lateral direction and, in the end, the entire aluminum film is converted to an oxide film. However, the adhesiveness (adhesion force) between the oxide film and the support is not necessarily good, and it was observed that the oxide film was sometimes easily delaminated when rubbed with a finger.

Figure 2:
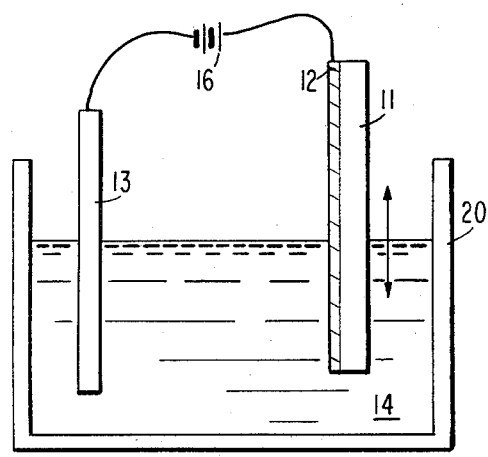
FIG. 2 is a diagram illustrating one embodiment of the anodic oxidation step in the present invention, wherein 14 is an electrolytic solution, 11 and 12 are a support and an aluminum thin layer, respectively, which are the materials for producing the photomask material of the present invention, and the arrows indicate the directions of repeated movement of the above-described material.
Figure 3:
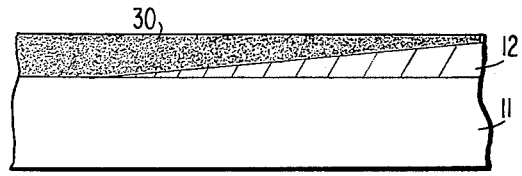
FIG. 3 is a cross sectional view of the above-described material at on stage in the anodic oxidation step shown in FIG. 2, which shows the state of progress of oxidizing the aluminum thin film layer, wherein 12 designates the remaining portion of aluminum thin layer and 30 designates the oxidized portion of the thin film layer.

Then, the following method was tried. That is, as is shown in FIG. 2, glass plate 11 having a vacuum-deposited aluminum film and a cathode (e.g., aluminum plate) are suspended in vessel 20 containing electrolytic solution 14 and, after connecting the voltage source 16, glass plate 11 is slowly and continuously moved upwards and downwards. Therefore, the lower end of aluminum film 12 is in contact with the electrolytic solution for the longest period of time (i.e., is electrolyzed for the longest time), whereas the upper end thereof is in contact with the solution for the shortest period of time. With the portions of the aluminum film between the two ends, the electrolysis time continuously decreases from the lower end to the upper end. As a result, as is shown in FIG. 3, anodic oxidation proceeds to the greatest extent at the lower end to such a degree that the entire aluminum layer becomes a transparent oxide film, the oxide film becoming thinner in the upward direction. In FIG. 3, the portion indicated by numeral 30 is the region where aluminum film is converted to the oxide film.

Strangely enough, it was found that, when the anodic oxidation is effected in the above-described manner wherein the oxide film becomes thicker in the direction of from one end to the other end, the intimate adhesiveness between the oxide film and the support is excellent with no possibility of the aluminum film remaining in the form of islands as described above.

As was described above, as a result of extensive investigations with respect to the above-described problems, the present invention has been achieved.

As has already been described, the possibility of applying the art relating to the so-called aluminum photo materials to the production of photomask materials was examined and, as a result, it has been found that important technical differences exist between these apparently closely resembling two arts.

The advantages of the photomask material of the present invention will be described below in comparison with the properties of the aluminum photo material.

1. With the aluminum photo material, an oxide film of a thickness of about 10 $\mu$ is usually necessary for obtaining silver images with sufficient optical density, whereas in the present invention sufficient density can be obtained with an oxide film having a thickness of about 2 $\mu$. A thin oxide film is advantageous for a photomask having high resolving power since reduction of resolving power due to light-scattering in the oxide film is small.

2. With the conventional aluminum photo, silver halide can be incorporated in the fine pores of the oxide film in an amount of about 5 volume % at the highest. Because, if silver halide is incorporated in an amount greater than this, a non-understandable phenomenon of a reduction in the silver image density occurs. However, in the present invention, the advantageous phenomenon that the silver image density increases as the amount of silver halide incorporated in the fine pores increases has been discovered. That is, in the production of the conventional aluminum photo material, the following strange phenomenon occurs. That is, when, e.g., silver nitrate is first incorporated and then potassium bromide is fed into the fine pores to deposit silver halide grains therein and, after drying, this processing is repeated to further fill the pores with silver halide, the optical density of the silver images becomes lower than that of the case of conducting the process for incorporating the silver halide only one time. If the process for incorporating the silver halide is conducted three times, the optical density of silver images is further reduced. In contrast, in the present invention, the optical density of the silver images increases as the number of times that the process for incorporating the silver halide is conducted. This fact is completely opposite to the phenomenon which occurs with the conventional aluminum photo. This is extremely effective for the purpose of obtaining silver images with a high optical density from a thin oxide film.

3. With the conventional aluminum photo, the shelf life of the photographic material is shorter than that of a usual silver halide photographic material having a silver halide emulsion layer as a light-sensitive layer, probably because of the presence of an aluminum layer under the aluminum oxide layer. Aluminum is quite active to silver halide and reduces silver halide to silver when contacted. However, in the present invention, an aluminum layer is not present under the aluminum oxide layer, and hence the shelf life of the photographic material of the present invention is extended.

As is seen from the above description, the art of the present invention is quite different from that of the aluminum photo material.

Each element of the present invention is explained in greater detail below. A transparent support is used in the present invention. The term "transparent support" designates a support which is capable of transmitting not less than about 50%, preferably not less than 70%, of electromagnetic waves in the near ultraviolet (e.g., about 2900 A to 4000 A) range and visible light (e.g., about 4000 A to 7000 A) range. Various transparent materials capable of transmitting visible light and ultraviolet light are suitable such as a transparent glass plate, a transparent plate of natural mineral (e.g., sapphire, quartz, etc.), a transparent plastic plate (e.g., polymethyl methacrylate plate, etc.), and the like. These supports are generally used in a plate-like form and provide a sufficient function as the support of the photomask as long as a thickness suitable for use as a photomask (usually about 0.5 mm to 3 mm) is employed. The function required for the support is to retain mask images, without deformation, formed in the mask image layer on the support.

On the transparent support is provided an aluminum thin film layer. Conventionally known metal film-forming methods such as vacuum deposition or sputtering can be utilized for this purpose. Suitable metal film-forming methods which can be used are described in L.I. Maissel & R. Glang, Handbook of Thin Film Technology, Chapter 1, McGraw-Hill, (1970). The thickness of the thin film layer formed is preferably about 1 to 20 $\mu$. If a thickness less than about 1 $\mu$ is employed, the silver image density as a photomask image is so low that a practically usable photomask cannot be produced, whereas if the thickness is greater than about 20 $\mu$, not only is such economically disadvantageous but also the resolving power of silver images formed later is reduced. In brief, a necessary and sufficient thickness is employed and, a more preferred, ranges from about 2 to about 10 $\mu$.

After forming an aluminum film on the transparent support in the above-described manner, this aluminum film is subjected to anodic oxidation. This anodic oxidation is the most important step in the production of the photomask material of the present inventon and must be effected with utmost care. When some aluminum remaining in the form of, e.g., islands, in the aluminum oxide film formed by the anodic oxidation does not cause any serious problems in the use of the photomask, the anodic oxidation can be effected in a common manner, e.g., by gently immersing the laminate containing an aluminum film in an electrolytic solution (or with stirring of the electrolytic solution, i.e., under the conditions different from that in the present invention to be described hereinafter). However, since it is desirable to produce photomask materials without such defects, the anodic oxidation is preferably effected under the conditions described hereinafter. That is, the anodic oxidation is conducted under conditions such that the anodic oxidation rate of the aluminum thin film is continuously reduced in the direction of from one portion of this film layer to another portion thereof. The reasons for such conditions are as follows. If the anodic oxidation is effected from the surface depthwise to the support at a uniform rate, aluminum (unoxidized) areas remain in an island-like shape, while, if the anodic oxidation is effected in the direction parallel to the surface of the thin film layer, a change in volume occurs upon oxidation, especially at the boundary between the thin layer and the support, and thus the adhesion between the thin layer and the support is greatly reduced. The above-described conditions can be achieved by continuously reducing the time of immersion of the thin layer in the electrolytic solution in the direction of from one portion of the thin layer to another portion thereof (e.g., a ratio of about 1:0.9 to about 1:0.5), as is explained by reference to FIG. 2, to thereby achieve a gradient in the anodic oxidation rate (e.g., a ratio of about 1:0.9 to about 1:0.5); by immersing an aluminum film layer-containing laminate in an electrolytic solution bath in which the temperature is continuously varied in the direction of from one portion of the thin layer to another portion thereof (e.g., a gradient of about 2 to 15°C) to thereby achieve a gradient in the anodic oxidation rate (e.g., a ratio of about 1:0.9 to about 1:0.5); or further, by disposing the above-described laminate at an angle, connecting the lower end (located at the lower portion) of the laminate to an anode terminal, releasing an electrolytic solution toward the upper end through a nozzle connected to cathode to thereby allow the electrolytic solution to flow down toward the lower end of the laminate (e.g., a rate ratio of about 1:0.9 to about 1:0.5), thus achieving a continuous reduction in the anodic oxidation rate (e.g., a ratio of about 1:0.9 to 1:0.5) in the direction of from the upper end to the lower end of the laminate due to a change in the electrolytic solution property between the upper end and the lower end of the laminate. When anodic oxidation of the aluminum film is conducted under such conditions, the anodic oxidation proceeds, for example, as is illustrated in FIG. 3. Therefore, the aluminum film is completely changed to aluminum oxide and becomes transparent. The resulting oxide film contains a number of fine-size pores formed over the entire film with a uniform distribution. It should be recognized that the above ratios described are merely exemplary and illustrative and the essential characteristic is that a gradient in the anodic oxidation rate is achieved. The aluminum oxide film thus formed generally has a thickness ranging from about 1.5 $\mu$ to 30 $\mu$; has a degree of transparency substantially the same as that of the transparent support hereinbefore described, and contains pores ranging in size from about 200 A to 1000 A.

As the electrolytic solution to be used for the anodic oxidation of aluminum, an oxalic acid aqueous solution at a concentration of about 1 to 20% by weight, a sulfuric acid aqueous solution at a concentration of about 2 to 25% by weight and other known solutions can be used. The electrolysis conditions can be appropriately selected and generally are within the following ranges: electric voltage: about 10 to 120 v; electric current density: about 5 to 30 A/ft$^2$; temperature: about 1° to 60°C.

These ranges are illustrated for convenience for procedures generally used and, needless to say, conditions other than the above-described conditions can be employed as long as the oxide film is formed.

After forming a transparent, porous and thick aluminum oxide film intimately adhered to the support, silver halide grains are provided in the fine pores of the aluminum oxide film, for example, as disclosed in U.S. Pat. No. 3,615,553. This can be effected by bringing the porous aluminum oxide film into contact with a silver nitrate aqueous solution to fill the fine pores in the thin film with silver nitrate, and then bringing the porous aluminum oxide film into contact with an aqueous solution containing a halogen ion such as potassium bromide, potassium chloride, etc., to thereby precipitate silver halide in the fine pores. Also, silver halide can be provided in the fine pores by reversing the order of the above-described procedures.

For example, to render the oxide film light-sensitive the following can be suitably used.

First Solution

A silver nitrate aqueous solution in a concentration of about 10 to 50% by weight is mainly used, to which gelatin (about 0.1 to 1.0 wt%) is preferably added in a small amount.

Second Solution

An aqueous solution containing a halogen ion such as potassium bromide, potassium chloride, sodium chloride, ammonium chloride, ammonium iodide, etc., or a mixture thereof, in an concentration of about 2 to 20 wt% can be suitably used. If desired, potassium ferrocyanide can be added in a small amount.

The aluminum thin film is contacted with the first solution for a short period of time (e.g., about 0.5 to 5 seconds) to fill the fine pores with silver nitrate, and then contacted with the second solution for a short period of time (e.g., about 0.5 to 5 seconds) to precipitate silver halide in the fine pores, followed by washing for a short period of time (e.g., about 5 to 30 seconds) and drying. The above-described procedures can be effected in the reverse order, if desired. That is, the aluminum thin film can be processed with the second solution and then with the first solution.

The thus sensitized oxide film is exposed, development-processed and fixed in the same manner as conventional silver halide photographic materials to obtain silver images.

Suitable exposure can be to visible light having a wavelength of about 4000 A to 7000 A, to ultraviolet light having a wavelength of about 2900 A to 4000 A, to X-rays, both soft and hard, and to electron beams having an acceleration voltage of about 5 kv to 100 kv.

Suitable developing agents which can be used in the method of the present invention are dihydroxybenzenes (e.g., hydroquinone, chlorohydroquinone, bromohydroquinone, isopropylhydroquinone, toluhydroquinone, methylhydroquinone, 2,3-dichlorohydroquinone, 2,5-dimethylhydroquinone, etc.), 3-pyrazolidones (e.g., 1-phenyl-3-pyrazolidone, 1-phenyl-4-methyl-3-pyrazolidone, 1-phenyl-4,4-dimethyl-3-pyrazolidone, 1-phenyl-4-ethyl-3-pyrazolidone, 1-phenyl-5-methyl-3-pyrazolidone, etc.), aminophenols (e.g., o-aminophenol, p-aminophenol, N-methyl-o-aminophenol, N-methyl-p-aminophenol, 2,4-diaminophenol, etc.), pyrogallol, ascorbic acid, 1-aryl-3-aminopyrazolines (e.g., 1-(p-hydroxyphenyl)-3-aminopyrazoline, 1-(p-methylaminophenyl)-3-pyrazoline, 1-(p-aminophenyl)-3-pyrazoline, 1-(p-amino-m-methylphenyl)-3-aminopyrazoline, etc.), and a mixture thereof, which are conventional and well known in the art.

The developer generally has a pH of not less than about 8, preferably about 8.5 to 12.5.

The developer can contain, if desired, a preservative (e.g., sulfite, bisulfite, etc.), a buffer (e.g., a carbonate, sulfuric acid, a sulfate, an alkanolamine, etc.), an alkali agent (e.g., a hydroxide, a carbonate, etc.), a dissolving aid (e.g., polyethylene glycol, etc.), a pH-adjusting agent (e.g., acetic acid or a like organic acid, etc.), a sensitizing agent (e.g., a quaternary ammonium salt, etc.), a development accelerator, a surface active agent, etc.

Suitable silver halide-fixing agents include conventional solvents for silver halide well known in the art, such as a water-soluble thiosulfate (e.g., potassium thiosulfate, sodium thiosulfate, ammonium thiosulfate, etc.), a water-soluble thiocyanate (e.g., potassium thiocyanate, sodium thiocyanate, ammonium thiocyanate, etc.), a water-soluble organic diol (e.g., 3-thia-1,5-pentanediol, 3,6-dithia-1,8-octanediol, 3,6,9-trithia-1,11-undecanediol, 3,6,9,12-tetrathia-1,14-tetradecanediol, etc.), a water-soluble sulfur-containing organic dibasic acid (e.g., ethylenebisthioglycolic acid, etc.), etc., and a mixture thereof.

The fixing agent-containing solution can contain, if desired, a preservative (e.g., a sulfite, a bisulfite, etc.), a pH buffer (e.g., boric acid, a borate, etc., a pH-adjusting agent (e.g., acetic acid, etc.), a chelating agent, and the like.

The photomask material of the present invention possesses the following excellent properties as compared with conventionally known emulsion masks and hard masks. First, in comparison with the emulsion mask, silver images formed on the photomask possesses a much higher durability (the same as or greater than the durability of the hard mask), and the aluminum oxide film is extremely hard. A pre-sealing process can render the photomask even more durable, which is incompatible with the gelatin film of the emulsion mask. Also, the edge acuity of the photomask is superior to the edge acuity of the emulsion mask. In addition, since the silver grains forming the silver image are small in size, the silver image can be made transparent to visible light, which enables the transparency to be changed or the silver image can be rendered opaque through intensification or toning, e.g., as disclosed in Pierre Glafkides, Photographic Chemistry Vol. 2, Chapter XIII, Fountain Press, London (1958).

On the other hand, in comparison with the hard mask, the silver image of the photomask prepared from the photomask material of the present invention is formed inside the aluminum oxide film, and hence there is no possibility for the projecting mask image to be chipped as in the case of the hard mask. In addition, the surface reflection is very small, which is an extremely excellent photomask property. In addition, a photomask using the photomask material of the present invention can be prepared using only three steps (exposure, development and fixation) and therefore the steps are simple and the number of steps required are small in comparison with the steps for preparing the hard mask which involve a photoresist coating step, an exposing step, a developing step, an etching step and a resist removal step. In addition, taking into consideration that, with the hard mask, a master of the emulsion mask is further necessary, it can be seen that the photomask material of the present invention is much superior. Further, the light sensitivity of the photomask material is incompatible with the hard mask as has already been described.

The present invention will now be illustrated in greater detail by reference to the following non-limiting examples of preferred embodimetns of the present invention. Unless otherwise indicated, all parts, percents, ratios and the like are by weight.

EXAMPLE 1

Aluminum (purity: 99.99%) was vacuum-deposited on a 1.8 mm-thick glass plate in a thickness of 4 $\mu$. Then, the resulting aluminum layer was subjected to anodic oxidation according to the method explained with reference to FIG. 2. As a cathode, an aluminum plate was used. The glass plate was vertically moved up and down about 12 times per minute at a speed of 2.5 cm/sec. The electric voltage for the electrolysis was 45 v, the electric current density for the electrolysis was 2 A/dm$^2$, and the solution temperature was about 50°C. The anodic oxidation was completed in about 10 minutes. The thus formed oxide film had a thickness of about 5.0 $\mu$. This film was washed with water and dried, and then rendered light-sensitive according to the following method.

The glass plate having thereon the oxide film formed by the foregoing anodic oxidation was contacted with the following first solution for 1.5 seconds, followed by removing excess solution on the surface and drying. Then, the glass plate was contacted with the following second solution for about 1.5 seconds and the excess solution on the surface was removed, followed by washing with water and drying.

| First Solution | |
|---|---|
| Silver Nitrate | 400 g |
| Gelatin | 6 g |
| Conc. Nitric Acid | 1 ml |
| Water to make | 1 l |
| Second Solution | |
| Potassium Bromide | 50 g |
| Potassium Ferrocyanate | 30 g |
| Water to make | 1 l |

The material subjected to the above-described processing to render the material light-sensitive was usable as a photomask material. This material had a structure in which a number of fine pores in the oxide film were filled with silver halide. This material was imagewise exposed and development-processed for 5 seconds in a developer having the following composition. Then, the material was immediately washed for 5 seconds with water, and fixed for 10 seconds in a fixing solution having the following composition, followed by washing with water and drying. The thus obtained silver image possessed an optical transmission density of 0.6 at a wavelength of 450 m$\mu$. This material was then immersed for about 1 minute in an intensifier having the following composition and washed with water immersing the material for 2 minutes in a developer having the following composition, the optical transmission density increased to about 1.2. The material was then placed in boiling distilled water for 15 minutes, followed by drying. Thus, a durable image was obtained.

| (1) Developer | |
|---|---|
| Sodium Sulfite (anhydrous) | 30.0 g |
| Paraformaldehyde | 7.5 g |
| Potassium Metabisulfite | 2.6 g |
| Boric Acid | 7.5 g |
| Hydroquinone | 22.5 g |
| Potassium Bromide | 1.6 g |
| Water to make | 1 l |
| (2) Fixing Solution | |
| 70% Aqueous Solution of Ammonium Thiosulfate | 200 cc |
| Sodium Sulfite | 15 g |
| Boric Acid | 8 g |
| Glacial Acetic Acid | 16 cc |
| Aluminum Sulfate | 10 g |
| Sulfuric Acid | 2 cc |
| Water to make | 1 l |
| (3) Intensifier | |
| Chloroauric Acid | 0.6 g |
| Ammonium Thiocyanate | 105 g |
| Water to make | 1 l |

EXAMPLE 2

The same procedures as described in Example 1 were conducted except for changing the thickness of the aluminum film to 6 $\mu$ and conducting the processing for rendering the oxide film light-sensitive two times. The optical transmission density of the resulting silver image was about 2.2. The toning processing of Example 1 was not effected.

While the invention has been described in detail and with reference to specific embodiments thereof, it will be apparent to one skilled in the art that various changes and modifications can be made therein without departing from the spirit and scope thereof.

What is claimed is:

1. A photomask material which comprises a transparent support having thereon an aluminum oxide thin film formed by anodic oxidation, said oxide thin film containing with a uniform distribution over the entire film a number of fine pores having a light-sensitive silver halide therein.

2. The photomask material of claim 1, wherein said transparent support is a support transparent to visible and ultraviolet light.

3. The photomask material of claim 2, wherein said transparent support is a glass plate, a natural mineral plate or a plastic plate.

4. The photomask material of claim 1, wherein said transparent support has a thickness ranging from about 0.5 mm to 3 mm.

5. The photomask material of claim 1, wherein the thickness of said aluminum oxide thin film ranges from about 1.5 to 30 microns.

6. A method for producing the photomask material of claim 1, which comprises providing an aluminum thin layer on a transparent support, anodically oxidizing said aluminum thin layer by contacting said aluminum thin layer with an electrolytic solution such that the rate of anodic oxidation of said aluminum thin layer is continuously reduced in a direction of from one portion of said thin layer to another portion of said thin layer to thereby render said thin layer transparent, and incorporating a light-sensitive silver halide in a number of the resulting fine pores formed in the aluminum oxide thin film and uniformly all over the aluminum oxide thin film.

7. The method of claim 6, wherein said contacting is by immersing said aluminum thin layer in an electrolytic solution and varying the time of immersing of the aluminum thin layer in said electrolytic solution in the direction of from one portion of said thin layer to another portion of said thin layer.

8. The method of claim 6, wherein said contacting is by immersing said aluminum thin layer in an electrolytic solution in which a temperature gradient exists in said electrolytic solution such that the temperature continuously varies in the direction of from one portion of said thin layer to another portion of said thin layer.

9. The method of claim 6, wherein said contacting is by flowing an electrolytic solution from a cathodically connected nozzle onto said aluminum thin layer from one portion of said thin layer to another portion of said thin layer anodically connected.

10. The method of claim 6, wherein said incorporating of said light-sensitive silver halide comprises contacting the resulting fine pores formed in the aluminum oxide thin film with an aqueous solution containing silver nitrate and subsequently with an aqueous solution containing a halogen ion or with an aqueous solution containing a halogen ion and subsequently with an aqueous solution containing silver nitrate.

* * * * *